US011844249B2

(12) United States Patent
Kim

(10) Patent No.: US 11,844,249 B2
(45) Date of Patent: Dec. 12, 2023

(54) DISPLAY DEVICE AND METHOD FOR MANUFACTURING THE SAME

(71) Applicant: Samsung Display Co., Ltd., Yongin-Si (KR)

(72) Inventor: Ji-Hyun Kim, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 217 days.

(21) Appl. No.: 17/320,680

(22) Filed: May 14, 2021

(65) Prior Publication Data

US 2022/0077270 A1 Mar. 10, 2022

(30) Foreign Application Priority Data

Sep. 9, 2020 (KR) .................. 10-2020-0115487

(51) Int. Cl.
  *H01L 21/00* (2006.01)
  *H10K 59/131* (2023.01)
  *H10K 59/121* (2023.01)
  *H10K 71/00* (2023.01)
  *H10K 59/12* (2023.01)

(52) U.S. Cl.
  CPC ......... *H10K 59/131* (2023.02); *H10K 59/121* (2023.02); *H10K 71/00* (2023.02); *H10K 59/1201* (2023.02)

(58) Field of Classification Search
  CPC .................................... H10K 59/131
  See application file for complete search history.

(56) References Cited

U.S. PATENT DOCUMENTS

| 2018/0190615 | A1* | 7/2018 | Pan ................ G06F 3/044 |
| 2019/0096864 | A1* | 3/2019 | Huitema ........... H01L 33/62 |
| 2020/0135126 | A1* | 4/2020 | Yokoyama ........ G09G 3/3648 |
| 2020/0211929 | A1 | 7/2020 | Son et al. |
| 2022/0020310 | A1* | 1/2022 | Gray ............... G09G 3/2088 |

FOREIGN PATENT DOCUMENTS

| JP | 2017134382 A | 8/2017 |
| KR | 1020170130286 A | 11/2017 |
| KR | 1020180100013 A | 9/2018 |
| KR | 1020190068112 A | 6/2019 |

* cited by examiner

*Primary Examiner* — Douglas M Menz
(74) *Attorney, Agent, or Firm* — CANTOR COLBURN LLP

(57) ABSTRACT

A display device includes a base substrate including a rigid material, a plurality of pixels disposed on a display area of the base substrate, a vertical conductive member disposed through the display area of the base substrate, a first transfer wiring electrically contacting the vertical conductive member and extending in a horizontal direction, and an under-panel driver disposed under the base substrate and electrically connected to the vertical conductive member.

8 Claims, 10 Drawing Sheets

DISPLAY DEVICE AND METHOD FOR MANUFACTURING THE SAME

This application claims priority to Korean Patent Application No. 10-2020-0115487, filed on Sep. 9, 2020, and all the benefits accruing therefrom under U.S.C. § 119, the content of which in its entirety is herein incorporated by reference.

BACKGROUND

1. Field

Embodiments relate to a display device. More particularly, embodiments relate a display device with a rear-bonding structure and a method for manufacturing the display device

2. Description of the Related Art

A display device typically includes a display area that displays an image and a peripheral area that does not display an image. A wiring for transferring a signal, a power or the like, which is used for the display area to display an image, may be disposed in the peripheral area.

Recently, a rear-bonding structure is being developed and researched to reduce a size of the peripheral area.

SUMMARY

Embodiments provide a display device having a reduced peripheral area (or bezel).

Embodiments provide a method for manufacturing the display device.

According to an embodiment, a display device includes a base substrate including a rigid material, a plurality of pixels disposed on a display area of the base substrate, a vertical conductive member disposed through the display area of the base substrate, a first transfer wiring electrically contacting the vertical conductive member and extending in a horizontal direction, and an under-panel driver disposed under the base substrate and electrically connected to the vertical conductive member.

In an embodiment, the base substrate includes glass.

In an embodiment, each of the pixels includes an active pattern, a gate electrode overlapping the active pattern and a signal wiring electrically connected to the active pattern. The vertical conductive member is electrically connected to the signal wiring.

In an embodiment, the first transfer wiring is formed on an upper surface of the base substrate, and electrically contacts the signal wiring.

In an embodiment, the display device further includes a first insulation layer covering the first transfer wiring. The active pattern is disposed on the first insulation layer.

In an embodiment, the first transfer wiring is disposed on a lower surface of the base substrate, and is partially covered by a lower capping layer disposed on the lower surface of the base substrate.

In an embodiment, the signal wiring includes a data line.

In an embodiment, the signal wiring includes a power line.

According to an embodiment, a display device includes a base substrate including a rigid material, a plurality of pixels disposed on a display area of the base substrate, a vertical conductive member disposed through the base substrate, and an under-panel driver disposed under the base substrate, where the vertical conductive member includes a plurality of transfer lines extending into a bonding area in the display area of the base substrate, and an under-panel driver disposed under the base substrate and electrically connected to the vertical conductive member.

According to an embodiment, a method for manufacturing a display device includes forming a trench at a display area of a base substrate including a rigid material, providing a conductive layer filling the trench on the base substrate, removing a portion of the conductive layer on the base substrate such that a vertical conductive member disposed in the trench is defined by a portion of the conductive layer filled in the trench, providing a pixel structure, which is electrically connected to the vertical conductive member, on the base substrate, and removing a lower portion of the base substrate to expose the vertical conductive member.

According to embodiments, an under-panel driver is disposed under a display panel, and the under-panel driver may electrically contact the display panel in an area overlapping a display area. Thus, a bezel or a peripheral area of a display device may be minimized.

In embodiments, a vertical conductive member, which forms an electric contact between the display panel and the under-panel driver, is formed in a trench of a base substrate before a driving element and a light-emitting element are formed. Thus, the vertical conductive member may not form a step on the base substrate, and may effectively prevent reliability deterioration due to the step in following processes.

In such embodiments, the vertical conductive member may be exposed through a substrate-slimming process after the driving element and the light-emitting element are formed without using a laser-drilling process for forming a via hole through the base substrate, such that damage to the light-emitting element that may occur in the laser-drilling process may be prevented. In such embodiments, since the vertical conductive member is formed prior to the driving element and the light-emitting element without inversing the display panel for filling the via hole, such that defects that may occur due to a process of inversing the display panel may be avoided.

BRIEF DESCRIPTION OF THE DRAWINGS

Features of embodiments of the invention will be more clearly understood from the following detailed description taken in conjunction with the accompanying drawings.

DETAILED DESCRIPTION

Figure 1:
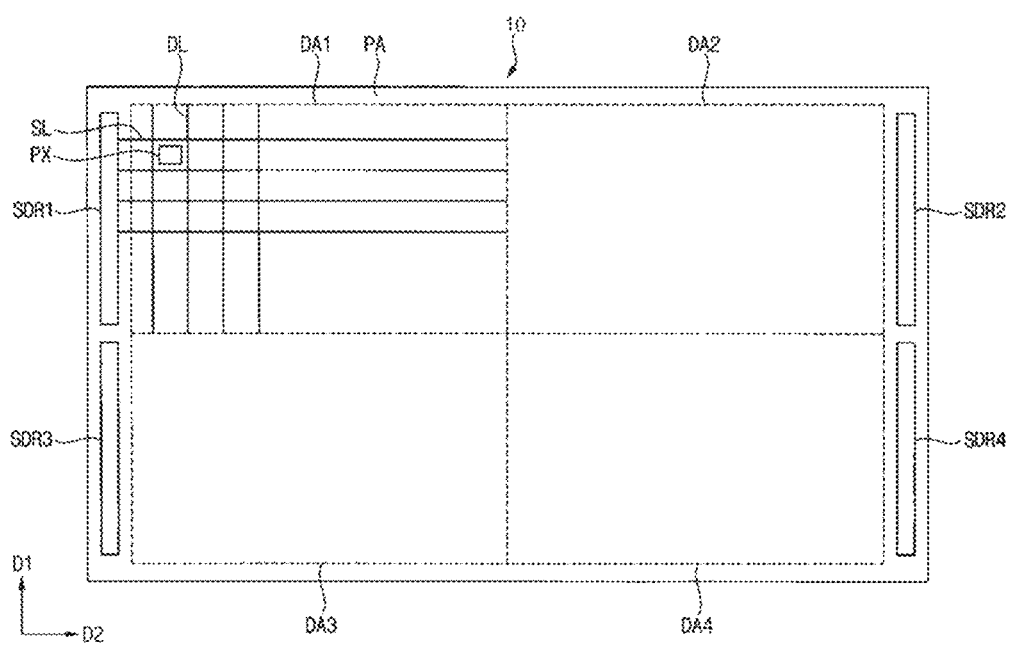
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Embodiments of a display device and a method for manufacturing a display device according to the invention will be described hereinafter with reference to the accompanying drawings, in which various embodiments are shown.

Figure 2:
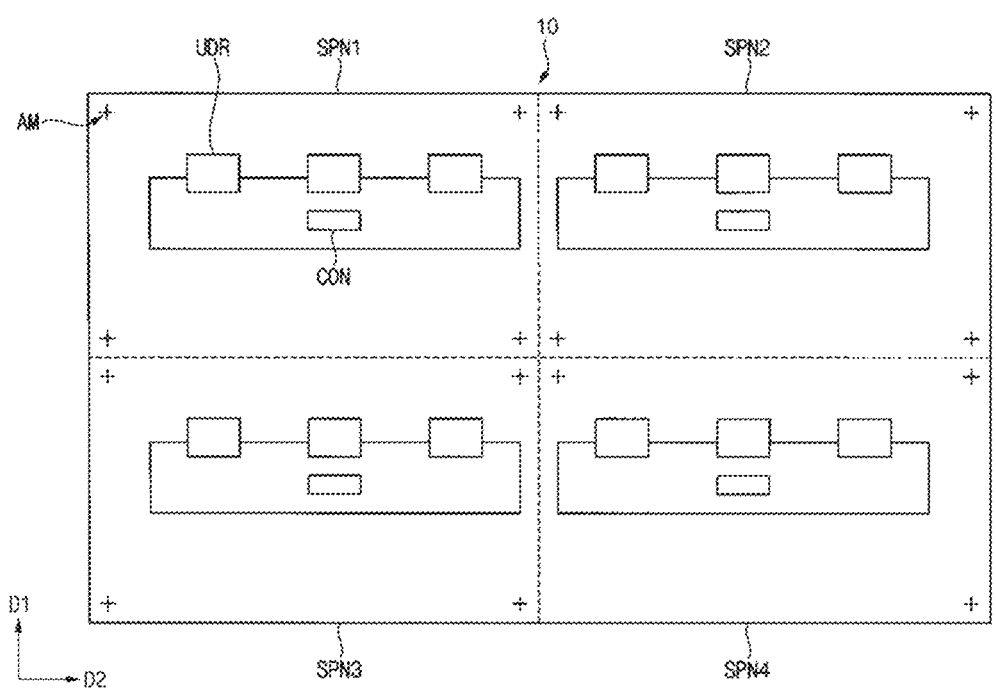
FIG. 2 is a bottom view illustrating a display device according to an embodiment.

FIG. 1 is a plan view illustrating a display device according to an embodiment. FIG. 2 is a bottom view illustrating a display device according to an embodiment.

Referring to FIG. 1, an embodiment of a display device 10 may include a display area, which generates an image, and a peripheral area PA adjacent to the display area. In one embodiment, for example, the peripheral area PA may surround the display area.

In an embodiment, the display area may include a plurality of display areas. In one embodiment, for example, the display area may include a first display area DA1, a second display area DA2, a third display area DA3 and a fourth display area DA4. In such an embodiment, a distance between the display areas DA1, DA2, DA3 and DA4 may be desired to be minimized so that a boundary between the display areas DA1, DA2, DA3 and DA4 may not be perceived by users. In one embodiment, for example, a distance between the first display area DA1 and the second display area DA2 may be substantially the same as or similar to a pitch of pixels adjacent to each other in the display area.

Referring to FIG. 2, the display device 10 may include a plurality of sub display panels. In one embodiment, for example, the display device 10 may include a first sub display panel SPN1 including the first display area DA1, a second sub display panel SPN2 including the second display area DA2, a third sub display panel SPN3 including the third display area DA3, and a fourth sub display panel SPN4 including the fourth display area DA4. The first to fourth sub display panels SPN1, SPN2, SPN3 and SPN4 may be individually formed and then combined with each other to manufacture a display device having a larger display area.

In an embodiment, a plurality of pixels PX may be disposed in each of the display areas DA1, DA2, DA3 and DA4. In such an embodiment, a data line DL extending in a first direction D1 and a scan line SL extending in a second direction D2 crossing the first direction D1 may be disposed in each of the display areas DA1, DA2, DA3 and DA4. A pixel structure including a light-emitting element and a driving element for driving the light-emitting element may be disposed in each of the pixels PX. In an embodiment, the display device may be an organic light-emitting display device. The light-emitting element may include an organic light-emitting diode. The driving element may include at least one thin film transistor.

The display device 10 may include a driver to drive the display areas DA1, DA2, DA3 and DA4. In an embodiment, the display areas DA1, DA2, DA3 and DA4 may be driven by different drivers, respectively. In one embodiment, for example, the display device 10 may include a first scan driver SDR1 for providing a scan signal to a scan line of the first display area DA1, a second scan driver SDR2 for providing a scan signal to a scan line of the second display area DA2, a third scan driver SDR3 for providing a scan signal to a scan line of the third display area DA3, and a fourth scan driver SDR4 for providing a scan signal to a scan line of the fourth display area DA4.

The first to fourth scan drivers SDR1, SDR2, SDR3 and SDR4 may be disposed in the peripheral area PA, and may be adjacent to the first to fourth display areas DA1, DA2, DA3 and DA4, respectively.

However, embodiments are not limited thereto. In one alternative embodiment, for example, the scan line of the first display area DA1 may be electrically connected to the scan line of the second display area DA2. In such an embodiment, the first scan driver SDR1 may provide a scan signal to the first and second display areas DA1 and DA2, and the second scan driver SDR2 may provide an emission signal to the first and second display areas DA1 and DA2.

The display device 10 may include a driver disposed outside the display panel. In one embodiment, for example, the display device 10 may include an under-panel driver UDR to provide a data signal to the data line DL. In one embodiment, for example, as illustrated in FIG. 2, the under-panel driver UDR may be bonded to a lower surface (a rear surface) of each of the sub display panels. The under-panel driver UDR may include an integrated circuit ("IC") chip, a substrate with an IC chip mounted thereon, a film with an IC chip mounted thereon or the like.

The under-panel driver UDR may be electrically connected to a control substrate CON. In an embodiment, the control substrate CON may provide a control signal to the under-panel driver UDR. In such an embodiment, the control substrate CON may provide a control signal to the scan drivers SDR1, SDR2, SDR3 and SDR4 or may provide a power to the pixels, through a substrate or a film, on which the under-panel driver UDR is mounted. The control substrate CON may be disposed on the lower surface of the sub display panels.

In an embodiment, the first to fourth sub display panels SPN1, SPN2, SPN3 and SPN4 may have a substantially same or similar configuration as each other. Thus, a configuration of the first sub display panel SPN1 will hereinafter be described in detail, and any repetitive detailed description of other sub display panels SPN2, SPN3 and SPN4 will be omitted or simplified. Hereinafter, for convenience of description, the first sub display panel may be referred to as a display panel, and the first display area may be referred to as a display area.

Figure 3:
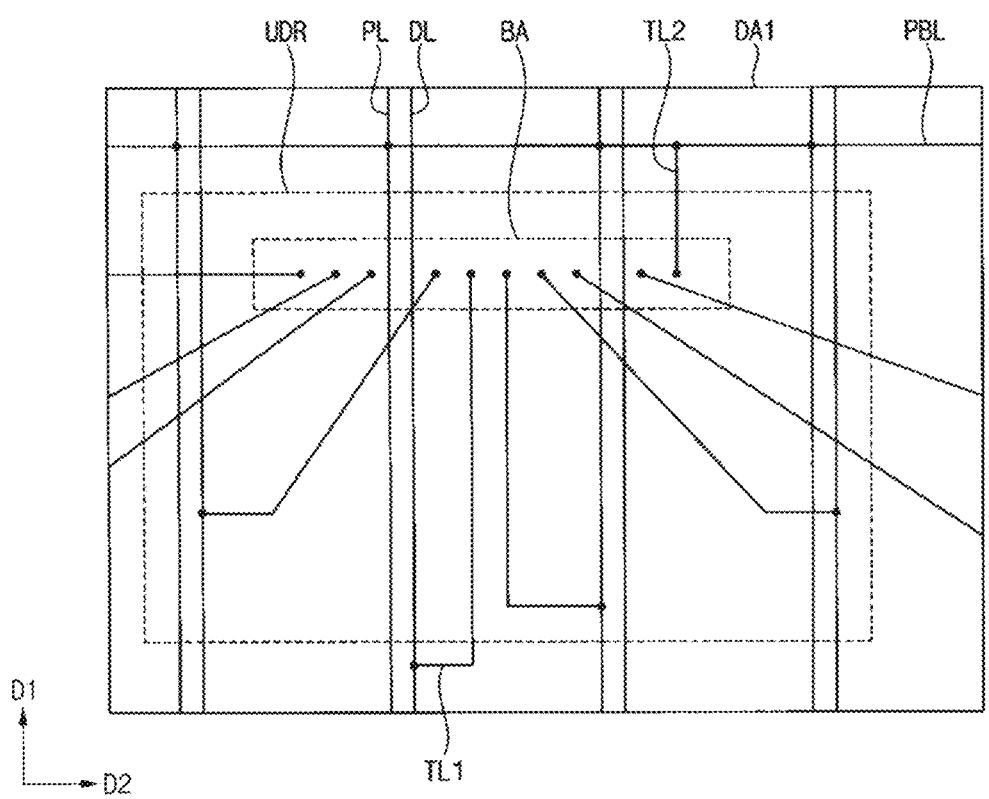
FIG. 3 is an enlarged plan view illustrating a bonding area of a display device according to an embodiment.
Figure 4:
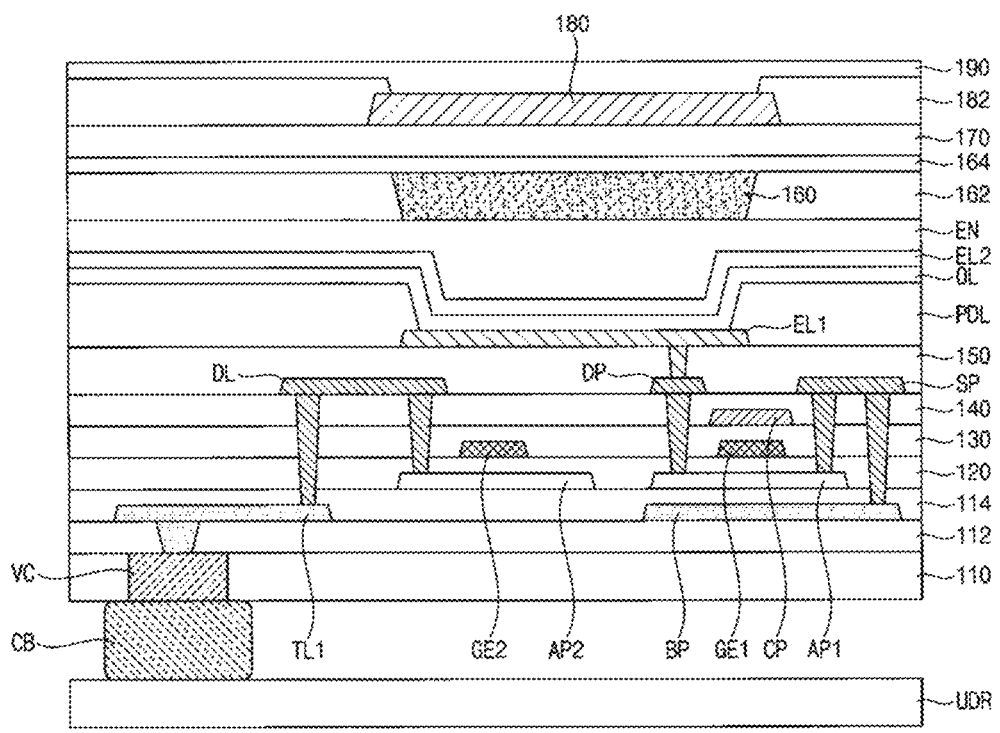
FIG. 4 is a cross-sectional view illustrating a display device according to an embodiment.

FIG. 3 is an enlarged plan view illustrating a bonding area of a display device according to an embodiment. FIG. 4 is a cross-sectional view illustrating a display device according to an embodiment.

In an embodiment, a display panel includes a transfer wiring disposed in a display area DA1 of a base substrate 110 of the display panel. Herein, the display area DA1 of the base substrate 110 is defined as a portion of the base substrate 110 corresponding to the display area DA1 of the display panel. The transfer wiring and the under-panel driver UDR may be electrically connected to each other through a vertical conductive member VC defined through the base substrate 110. In an embodiment, the vertical conductive member VC may be disposed or filled in an opening defined through the base substrate 110. In one embodiment, for example, the display panel may include an array of vertical conductive members VC arranged in a bonding area BA of the panel or on a bonding area of the base substrate 100 corresponding to the bonding area BA. The vertical conductive members VC may be electrically connected to transfer wirings, respectively. In one embodiment, for example, the display panel may include a first transfer wiring TL1 electrically connected to a data line DL.

In an embodiment, where the vertical conductive member VC is provided, an alignment mark AM illustrated in FIG. 2 may be provided or formed with the vertical conductive member VC. In such an embodiment, the alignment mark AM may be disposed through the base substrate 110. The alignment mark AM may have various shapes including a cross shape, a polygonal shape or the like, which are known in the art to be capable of functioning as an alignment mark. In one embodiment, for example, a plurality of alignment marks AM may be disposed adjacent to corners of the display panel.

In an embodiment, the display panel may further include a second transfer wiring TL2 electrically connected to a power transfer wiring PBL. In an embodiment, the power transfer wiring PBL may extend in a second direction D2 crossing the data line DL. The display panel may further include a power line PL to transfer a power voltage of the pixels. The power line PL may extend in a first direction D1 to be parallel with the data line DL. The power line PL may be electrically connected to the power transfer wiring PBL.

Referring to FIG. 4, the display panel may be combined with the under-panel driver UDR through a conductive bonding member CB. The conductive bonding member CB may electrically contact the vertical conductive member VC. Thus, a data signal generated in the under-panel driver UDR may be transferred to the data line DL through the vertical conductive member VC and the first transfer wiring TL1. In one embodiment, for example, the first transfer wiring TL1 may include a plurality of lines arranged in a form of a fan-out shape.

In an embodiment, a power voltage may be transferred to the power line PL from the under-panel driver UDR through the vertical conductive member VC and the second transfer wiring TL2.

In an embodiment, the display panel may further include a third transfer wiring (not shown) electrically connected to the first scan driver SDR1. A control signal may be transferred to a scan driver from the under-panel driver UDR through ta vertical conductive member and the third transfer wiring.

Referring to FIGS. 3 and 4, an embodiment of the display panel includes the base substrate 110 and the vertical conductive member VC disposed through the base substrate 110. A method for forming the vertical conductive member VC will be described later in detail.

The base substrate 110 may include a rigid transparent material. In one embodiment, for example, the base substrate 110 may include glass, quartz or the like. In an embodiment, the base substrate 110 may include glass.

A buffer layer 112 may be disposed on the base substrate 110. A lower conductive pattern may be disposed on the buffer layer 112.

The buffer layer 112 may prevent or reduce permeation of impurities, humidity or external gas from underneath of the base substrate 110, and may reduce a roughness of an upper surface of the base substrate 110. In one embodiment, for example, the buffer layer 112 may include an inorganic material such as silicon oxide, silicon nitride, silicon oxynitride or a combination thereof.

In an embodiment, the lower conductive pattern may include a first transfer wiring TL1. The first transfer wiring TL1 may extend into a bonding area BA, where the vertical conductive member VC is disposed, along a horizontal direction in the display area DA1. The first transfer wiring TL1 may electrically contact the vertical conductive member VC in the bonding area BA.

The lower conductive pattern may further include a lower shielding pattern BP. The lower shielding pattern BP may overlap at least a portion of an active pattern disposed thereon. Thus, variation of characteristics of a transistor due to an external light entering the active pattern may be effectively prevented.

In one embodiment, for example, the lower conductive pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

An active pattern is disposed on the lower conductive pattern. A first insulation layer 114 is disposed between the active pattern and the lower conductive pattern. A first gate metal pattern including a gate electrode is disposed on the active pattern. A second insulation layer 120 is disposed between the active pattern and the first gate metal pattern. A second gate metal pattern including a capacitor electrode pattern CP is disposed on the first gate metal pattern. A third insulation layer 130 is disposed between the first gate metal pattern and the second gate metal pattern. A fourth insulation layer 140 is disposed on the second gate metal pattern.

In an embodiment, the active pattern may include a metal oxide semiconductor. In one embodiment, for example, the active pattern may include a binary compound ($AB_x$), a ternary compound ($AB_xC_y$) or a quaternary compound ($AB_xC_yD_z$), which contains indium (In), zinc (Zn), gallium (Ga), tin (Sn), titanium (Ti), aluminum (Al), hafnium (Hf), zirconium (Zr), magnesium (Mg). In one embodiment, for example, the active pattern may include zinc oxide ($ZnO_x$), gallium oxide ($GaO_x$), titanium oxide ($TiO_x$), tin oxide ($SnO_x$), indium oxide ($InO_x$), indium-gallium oxide ("IGO"), indium-zinc oxide ("IZO"), indium tin oxide ("ITO"), gallium zinc oxide ("GZO"), zinc magnesium oxide ("ZMO"), zinc tin oxide ("ZTO"), zinc zirconium oxide ($ZnZr_xO_y$), indium-gallium-zinc oxide ("IGZO"), indium-zinc-tin oxide ("IZTO"), indium-gallium-hafnium oxide ("IGHO"), tin-aluminum-zinc oxide ("TAZO"), indium-gallium-tin oxide ("IGTO") or the like.

In an alternative embodiment, the active pattern may include multi-crystalline silicon (polysilicon).

In one embodiment, for example, at least a portion of the active pattern may be doped with n-type impurities or p-type impurities.

The active pattern may include a first active region AP1 overlapping a first gate electrode GE1 and a second active region AP2 overlapping a second gate electrode GE2. In an embodiment, the first active region AP1 and the second active region AP2 may be defined by a same pattern layer. However, embodiments are not limited thereto. In one alternative embodiment, for example, the active pattern may include a plurality of patterns spaced apart from each other.

In an embodiment, the first insulation layer 114, the second insulation layer 120, the third insulation layer 130 and the fourth insulation layer 140 may each include silicon oxide, silicon nitride, silicon oxynitride or a combination thereof. In an embodiment, the first insulation layer 114, the second insulation layer 120, the third insulation layer 130 and the fourth insulation layer 140 may each include an insulating metal oxide such as aluminum oxide, tantalum oxide, hafnium oxide, zirconium oxide, titanium oxide or the like. In one embodiment, for example, the first insulation layer 114, the second insulation layer 120, the third insulation layer 130 and the fourth insulation layer 140 may each have a single-layered structure or a multi-layered structure, which includes silicon nitride and/or silicon oxide.

In one embodiment, for example, the first and second gate metal patterns may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may each have a single-layered structure or a multi-layered structure including different metal layers.

The capacitor electrode pattern CP may overlap the first gate electrode GE1.

A source metal pattern may be disposed on the fourth insulation layer 140. In one embodiment, for example, the first source metal pattern may include a source pattern SP and a drain pattern DP, which is disposed or extends through an insulation layer thereunder to electrically contact the first active region AP1.

In an embodiment, the source pattern SP may be a power line for transferring a power voltage or may be a connection pattern electrically connected to the power line. The source pattern SP may electrically contact the lower shielding pattern BP to apply a constant voltage to the lower shielding pattern BP.

In an embodiment, the source metal pattern may further include a data line DL. The data line DL may be disposed or extend through an insulation layer thereunder to electrically contact the second active region AP2 and the first transfer wiring TL1.

In one embodiment, for example, the source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A fifth insulation layer 150 may be disposed on the source metal pattern. The fifth insulation layer 150 may cover a structure thereunder to planarize the substrate. The fifth insulation layer 150 may include an organic material. In one embodiment, for example, the fifth insulation layer 150 may include an organic insulation material such as a phenol resin, an acryl resin, a polyimide resin, a polyamide resin, a siloxane resin, an epoxy resin or the like. The fifth insulation layer 150 may be referred to as a first via insulation layer or a first organic insulation layer.

A light-emitting element may be disposed on the fifth insulation layer 150. The light-emitting element may include a first electrode EL1, an organic layer OL disposed on the first electrode EL1, and a second electrode EL2 disposed on the organic layer OL. The first electrode EL1 of the light-emitting element may be electrically connected to the drain pattern DP.

A pixel-defining layer PDL may be disposed on the fifth insulation layer 150. An opening is defined through the pixel-defining layer PDL to overlap at least a portion of the first electrode EL1. At least a portion of the organic layer OL may be disposed in the opening of the pixel-defining layer PDL. In an embodiment, the organic layer OL may include a common layer continuously extending over a plurality of pixel areas, or may have a pattern shape disposed within a pixel area. The pixel-defining layer PDL may include an organic material.

The first electrode EL1 may function as an anode. In one embodiment, for example, the first electrode EL1 may be a transmissive electrode or a reflective electrode based on an emission type of the display device. In an embodiment where the first electrode EL1 is a transmissive electrode, the first electrode EL1 may include indium tin oxide, indium zinc oxide, zinc tin oxide, indium oxide, zinc oxide, tin oxide or the like. In an alternative embodiment where the first electrode EL1 is a reflective electrode, the first electrode EL1 may include gold (Au), silver (Ag), aluminum (Al), copper (Cu), nickel (Ni), platinum (Pt), magnesium (Mg), chromium (Cr), tungsten (VV), molybdenum (Mo), titanium (Ti) or a combination thereof, and may have a stacked structure further including a material that may be used for the transmissive electrode.

The organic layer OL may include an emission layer, and may further include at least one selected from a hole injection layer ("HIL"), a hole transporting layer ("HTL"), an electron transporting layer ("ETL") and an electron injection layer ("EIL"). In one embodiment, for example, the organic layer OL may include a low molecular weight organic compound or a high molecular weight organic compound.

In an embodiment, the organic layer OL may emit a red light, a green light or a blue light. In an alternative embodiment, the organic layer OL may emit a white light. The organic layer OL emitting a white light may have a multi-layer structure including a red light-emitting layer, a green light-emitting layer and a blue light-emitting layer, or a single-layer structure including a mixture of a red light-emitting material, a green light-emitting material and a blue light-emitting material.

The second electrode EL2 may function as a cathode. The second electrode EL2 may be formed as a transmissive electrode or a reflective electrode based on an emission type of the display device. In one embodiment, for example, the second electrode EL2 may include a metal, a metal alloy, a metal nitride, a metal fluoride, a conductive metal oxide or a combination thereof.

In one embodiment, for example, the second electrode EL2 may be a common layer extending continuously over a plurality of the pixel areas.

An encapsulation layer EN may be disposed on the second electrode EL2. The encapsulation layer EN may have a stacked structure of an inorganic thin film and an organic thin film. In one embodiment, for example, the encapsulation layer EN may include a first inorganic thin film, an organic thin film disposed on the inorganic thin film and a second inorganic thin film disposed on the organic thin film. However, embodiments are not limited thereto. In one alternative embodiment, for example, an encapsulation layer may include at least two organic thin films and at least three inorganic thin films, which are stacked one on another.

In one embodiment, for example, the organic thin film may include a cured polymer resin such as poly(meth) acrylate or the like. In one embodiment, for example, the cured polymer resin may be formed by cross-linking reaction of monomers. In one embodiment, for example, the inorganic thin films may include silicon oxide, silicon nitride, silicon oxynitride, aluminum oxide, tantalum oxide, hafnium oxide, zirconium oxide, titanium oxide or a combination thereof.

A color-converting pattern 160 and a partition wall 162 may be disposed on the encapsulation layer EN.

In an embodiment, the color-converting pattern 160 may include a wavelength-converting material. In one embodiment, for example, the color-converting pattern 160 may include a quantum dot and a resin part in which the quantum dot is dispersed.

The quantum dot may be defined as a nano-crystalline semiconductor material. The quantum dot may absorb an incident light and emit a light having a wavelength different from the incident light. In one embodiment, for example, the quantum dot may have a diameter equal to or less than about 100 nanometers (nm). In an embodiment, the quantum dot may have a diameter in a range of about 1 nm to about 20 nm.

In an embodiment, the quantum dot may include a II-VI group compound, a III-V group compound, a IV-VI group compound, a IV group element, a IV group compound or a combination thereof.

In one embodiment, for example, the II-VI group compound may include a binary compound selected from CdSe, CdTe, ZnS, ZnSe, ZnTe, ZnO, HgS, HgSe, HgTe, MgSe, MgS and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

In one embodiment, for example, the III-V group compound may include a binary compound selected from GaN, GaP, GaAs, GaSb, AlN, AlP, AlAs, AlSb, InN, InP, InAs, InSb and a combination thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof.

In one embodiment, for example, the IV-VI group compound may include a binary compound selected from SnS, SnSe, SnTe, PbS, PbSe, PbTe and a combination thereof, a ternary compound selected from SnSeS, SnSeTe, SnSTe, PbSeS, PbSeTe, PbSTe, SnPbS, SnPbSe, SnPbTe and a combination thereof, or a quaternary compound selected from SnPbSSe, SnPbSeTe, SnPbSTe and a combination thereof.

In one embodiment, for example, the IV group element may include Si, Ge or a combination thereof. The IV group compound may include a binary compound selected from SiC, SiGe and a combination thereof.

In one embodiment, for example, the quantum dot may have a core-shell structure including a core and a shell which surrounds the core. In one embodiment, for example, the core and the shell may include different materials from each other.

In one embodiment, for example, the resin part may include an epoxy resin, an acrylic resin, a phenolic resin, a melamine resin, a cardo resin, an imide resin or a combination thereof.

In an embodiment, the color-converting pattern 160 may further include a scattering particle. The scattering particle may scatter an incident light without substantially changing a wavelength of the incident light.

The scattering particle may include a metal oxide or an organic material. In one embodiment, for example, the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$) or the like. In one embodiment, for example, the organic material may include an acrylic resin, an urethane resin or the like.

In another pixel area, a compensation pattern (not shown) may be disposed on the encapsulation layer EN instead of the color-converting pattern 160. In one embodiment, for example, where the light-emitting element emits a blue light, a compensation pattern without a wavelength-converting material may be disposed in a pixel area configured to emit a blue light. In one embodiment, for example, the compensation pattern may include a resin part and a scattering particle.

In one embodiment, for example, the color-converting pattern 160 may be formed through an inkjet printing process. In one embodiment, for example, the partition wall 162 may form or define a receiving space for receiving an ink. An ink including a binder component, a quantum dot, a solvent and the like may be provided in the receiving space. The ink may be thermally cured or photo-cured to form the color-converting pattern 160.

In an embodiment, the partition wall 162 may include a light-blocking material such as a pigment, a dye, carbon black or the like. In one embodiment, for example, the partition wall 162 may be formed from a black matrix composition.

A low-refractive layer 170 may be disposed on the color-converting pattern 160 and the partition wall 162. A capping layer 164 may be disposed between the color-converting pattern 160 and the low-refractive layer 170.

The low-refractive layer 170 may have a refractivity less than the color-converting pattern and the compensation pattern. The low-refractive layer 170 may increase a light-extracting efficiency, thereby increasing brightness and durability of the display device. In one embodiment, for example, the low-refractive layer 170 may have a refractivity equal to or less than about 1.3.

The low-refractive layer 170 may include a hollow particle to have a desired refractivity. In an embodiment, the low-refractive layer 170 may include a hollow particle dispersed in a resin part.

The hollow particle may include an inorganic material. In one embodiment, for example, the hollow particle may include silica ($SiO_2$), magnesium fluoride ($MgF_2$), iron oxide ($Fe_3O_4$) or a combination thereof. In an embodiment, the hollow particle may include silica.

In one embodiment, for example, the capping layer 164 may include silicon oxide, silicon nitride, silicon oxynitride or a combination thereof.

A color filter 180 may be disposed on the low-refractive layer 170.

The color filter may selectively transmit a light having a specific color. In one embodiment, for example, the color filter may selectively transmit a red light, a green light or a blue light.

In one embodiment, for example, the light-emitting element may emit a blue light. The color-converting pattern 160 may include a wavelength-converting material to emit a red light. The color filter 180 may selectively transmit a red light. The color-converting pattern 160 may excite a blue light to emit a red light. A blue light, which is not wavelength-converted by the color-converting pattern 160, may be blocked by the color filter 180. As a result, a red light may be emitted from the display panel.

In one embodiment, for example, a display panel may include a light-emitting element that generates a blue light, a first color-converting pattern that changes a blue light to a red light, a second color-converting pattern that changes a blue light to a green light, a red color filter, a green color filter and a blue color filter to display an image with RGB configuration.

A light-blocking member 182 may be disposed on the low-refractive layer 170. The light-blocking member 182 may have a grid shape or a matrix shape, in a plan view. In one embodiment, for example, a light-emitting area and a light-blocking area may be defined by the light-blocking member 182. In one embodiment, for example, the light-blocking member 182 may include an opening, which corresponds to the light-emitting area.

The light-blocking member 182 may include a light-blocking material such as a pigment, a dye, carbon black or the like.

The display panel may further include a protective layer 190 covering the light-blocking member 182 and the color filter 180. In one embodiment, for example, the protective layer 190 may include an inorganic material, an organic material or a combination thereof.

FIGS. 5, 6, 7, 8, 9 and 10 are cross-sectional views illustrating a method for manufacturing a display device according to an embodiment.

Figure 5:
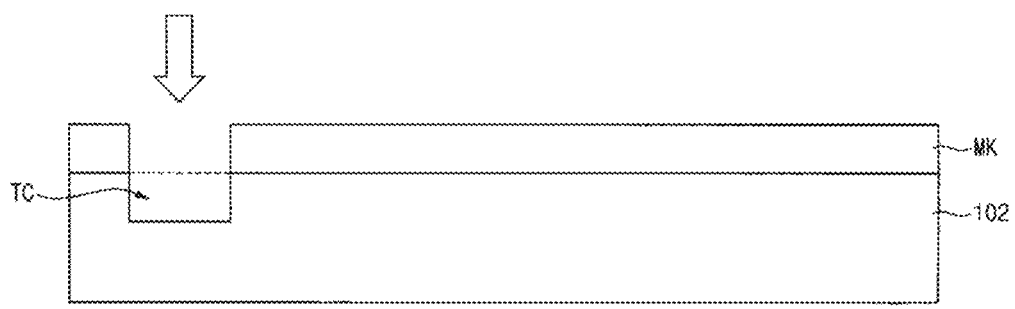
FIGS. 5, 6, 7, 8, 9 and 10 are cross-sectional views illustrating a method for manufacturing a display device according to an embodiment.

Referring to FIG. 5, a trench TC is formed at a surface of a preliminary substrate 102. In one embodiment, for example, the preliminary substrate 102 may include glass, quartz or the like. In an embodiment, the preliminary substrate 102 may include glass.

The trench TC may be formed by various methods that are conventionally know in the art. In one embodiment, for example, the trench TC may be formed by a laser drilling process, a photolithography process, a laser-induced deep etching process or the like.

In an embodiment, a mask MK, in which an opening is defined to correspond to the trench TC, may be formed on an upper surface of the preliminary substrate 102 through a light-exposure process and a developing process for a photolithography process. Thereafter, a portion of the preliminary substrate 102, which is exposed through the mask MK, may be wet-etched or dry-etched to form the trench TC.

In an embodiment, a depth of the trench TC may be equal to or less than a thickness of the preliminary substrate 102. If the depth of the trench TC is excessively large, the trench TC may not be effectively fully filled in a following process.

In an embodiment, the trench TC may be formed in a display area to correspond to the vertical conductive member VC illustrated in FIG. 4.

Figure 6:
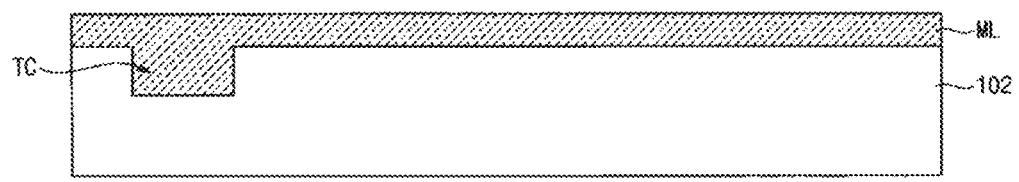

Referring to FIG. 6, a conductive layer ML is formed on the preliminary substrate 102 with the trench TC. In one embodiment, for example, the conductive layer ML may be formed by sputtering or the like. In one embodiment, for example, the conductive layer ML may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

In an embodiment, the conductive layer ML may have a sufficient thickness to fully fill the trench TC.

Figure 7:
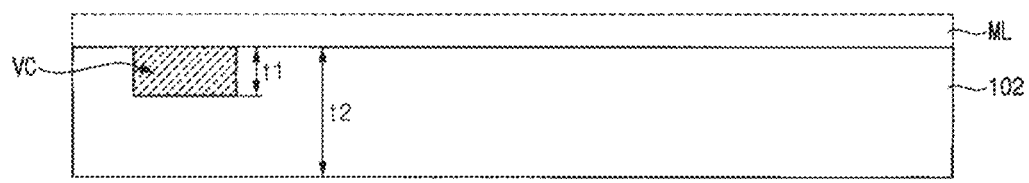

Referring to FIG. 7, the conductive layer ML is removed except for the portion thereof in the trench TC. In an embodiment, a chemical mechanical polishing process using a polishing slurry may be performed to remove the conductive layer ML.

As a result, a vertical conductive member VC filled in the trench TC may be formed. An upper surface of the vertical conductive member VC and an upper surface of the preliminary substrate 102 may form a continuously flat surface.

In an embodiment, a thickness t1 of the vertical conductive member VC may be equal to or less than a thickness t2 of the preliminary substrate 102.

In an embodiment, when the vertical conductive member VC is formed, the alignment mark AM illustrated in FIG. 2 may be formed simultaneously with the vertical conductive member VC. Thus, in the process illustrated in FIG. 5, a trench for the alignment mark AM may be further formed.

Figure 8:
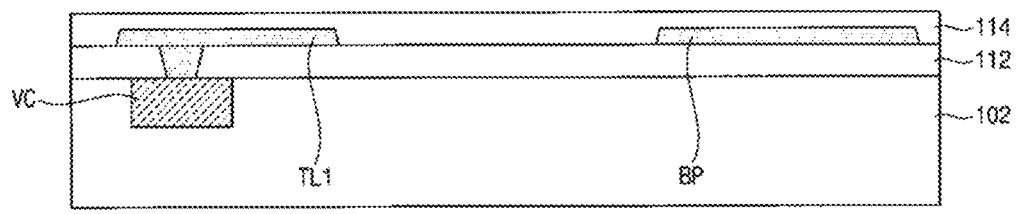

Referring to FIG. 8, a buffer layer 112 is provided or formed on the vertical conductive member VC and the preliminary substrate 102.

A lower conductive pattern including a first transfer wiring TL1 and a lower shielding pattern BP is provided or formed on the buffer layer 112. The first transfer wiring TL1 may extend in a horizontal direction, and may electrically contact the vertical conductive member VC through a contact hole defined or formed through the buffer layer 112.

Figure 9:
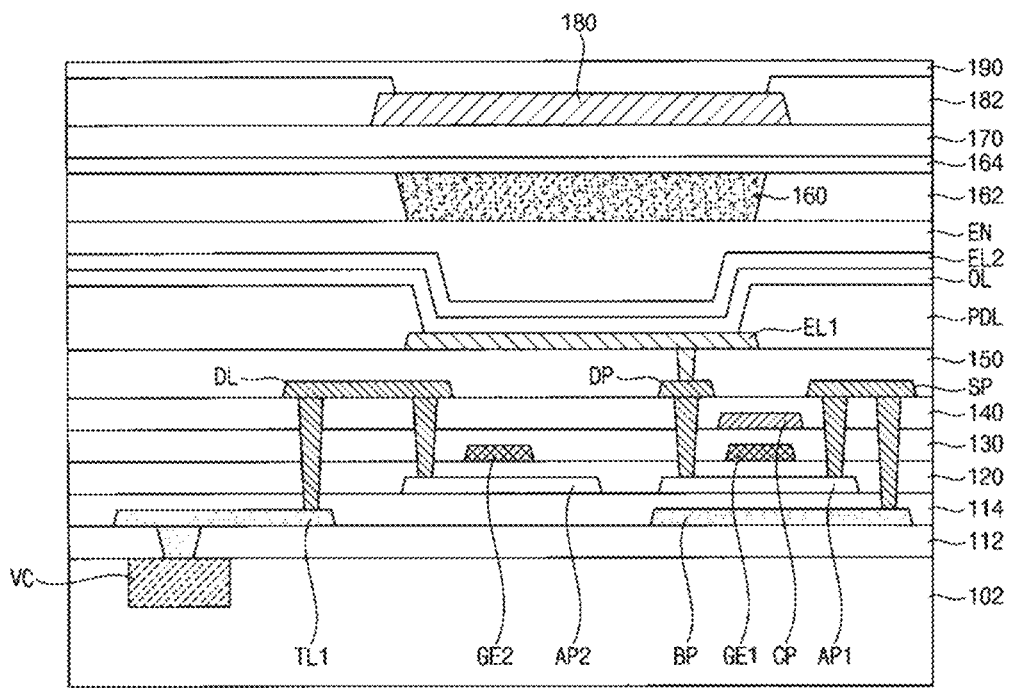

Referring to FIG. 9, a first insulation layer 114 is provided or formed on the lower conductive pattern. An active pattern is provided or formed on the first insulation layer 114. A second insulation layer 120 is provided or formed on the active pattern. A first gate metal pattern including gate electrodes GE1 and GE2 is provided or formed on the second insulation layer 120. A third insulation layer 130 is provided or formed on the first gate metal pattern. A second gate metal pattern including a capacitor electrode pattern CP is provided or formed on the third insulation layer 130. A fourth insulation layer 140 is provided or formed on the second gate metal pattern. A source metal pattern including a source pattern SP, a drain pattern DP and a data line DL is provided or formed on the fourth insulation layer 140. The data line DL may extend through insulation layers disposed thereunder to electrically contact the active pattern and the first transfer wiring TL1. An organic light-emitting diode and a pixel-defining layer PDL are provided or formed on the fifth insulation layer 150. An encapsulation layer EN is provided or formed on the organic light-emitting diode. A partition wall 162 and a color-converting pattern 160 are provided or formed on the encapsulation layer EN. A capping layer 164 is formed on the partition wall 162 and the color-converting pattern 160. A low-refractive layer 170 is provided or formed on the capping layer 164. A color filter 180 and a light-blocking member 182 are provided or formed on the low-refractive layer 170. A protective layer 190 is provided or formed on the color filter 180 and the light-blocking member 182.

Figure 10:
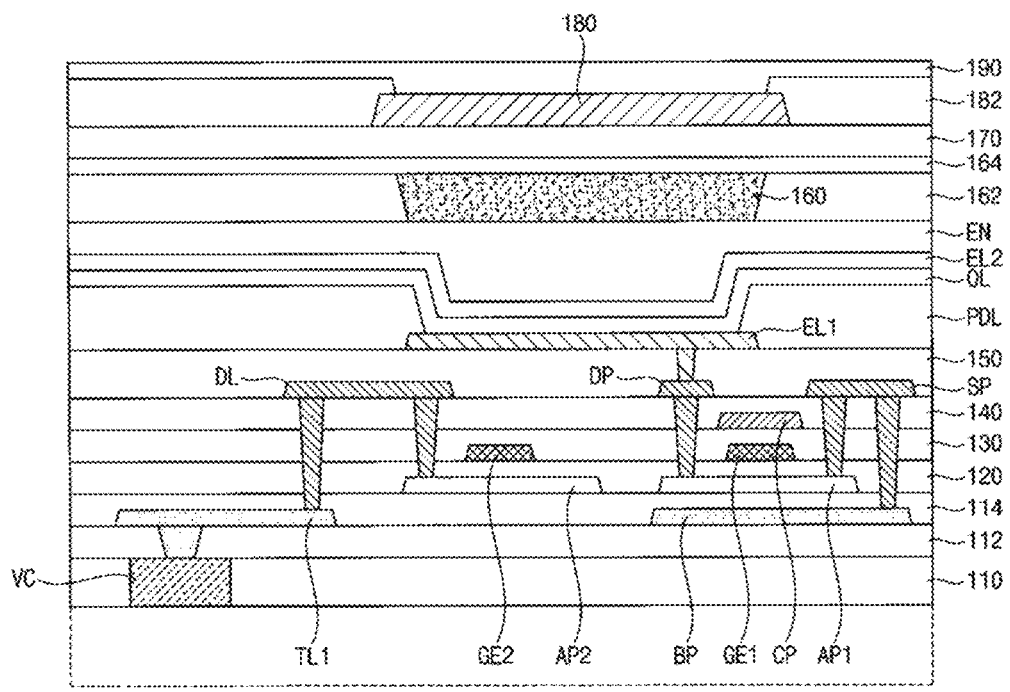

Referring to FIG. 10, a portion of the preliminary substrate is removed to expose a lower surface of the vertical conductive member VC. In one embodiment, for example, a lower portion of the preliminary substrate may be entirely removed through a chemical mechanical polishing process or the like until the lower surface of vertical conductive member VC is exposed.

Thereafter, as illustrated in FIG. 4, the vertical conductive member VC is electrically connected to an under-panel driver UDR by a conductive bonding member CB.

In an embodiment, the display panel may be a sub display panel. A plurality of sub display panels may be combined with each other before an the under-panel driver UDR is bonded to the sub display panels.

According to embodiments, an under-panel driver is disposed under a display panel. The under-panel driver may electrically contact the display panel in an area overlapping a display area. Thus, a bezel or a peripheral area of a display device may be minimized.

In such embodiments, a vertical conductive member, which forms an electric contact between the display panel and the under-panel driver, is formed in a trench of a base substrate before a driving element and a light-emitting element are formed. Thus, the vertical conductive member may not form a step on the base substrate, and may prevent reliability deterioration due to the step in following processes.

In an embodiment, the vertical conductive member may be exposed through a substrate-slimming process after the driving element and the light-emitting element are formed. Thus, since a laser-drilling process is not used for forming a via hole through the base substrate, damage to the light-emitting element may be prevented. In such an embodiment, since the vertical conductive member is formed prior to the driving element and the light-emitting element, the display panel may not to be inversed for filling the via hole. Thus, defects that may occur during the process of inversing the display panel may be avoided.

Figure 11:
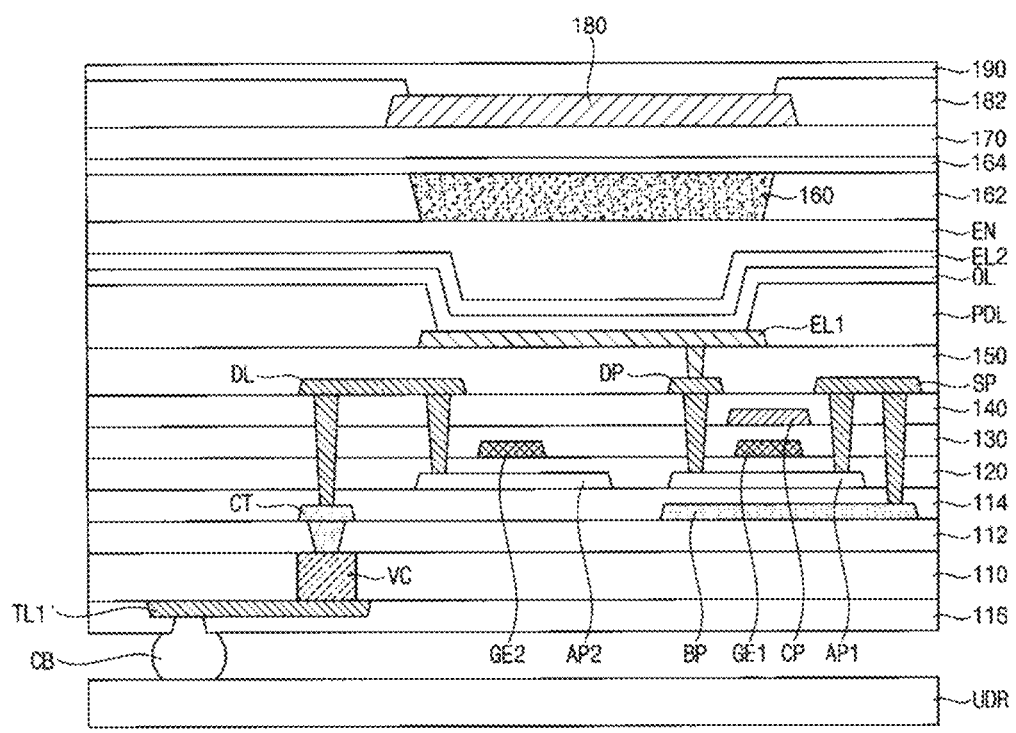
FIGS. 11 and 12 are cross-sectional views illustrating a display device according to alternative embodiments.
Figure 12:
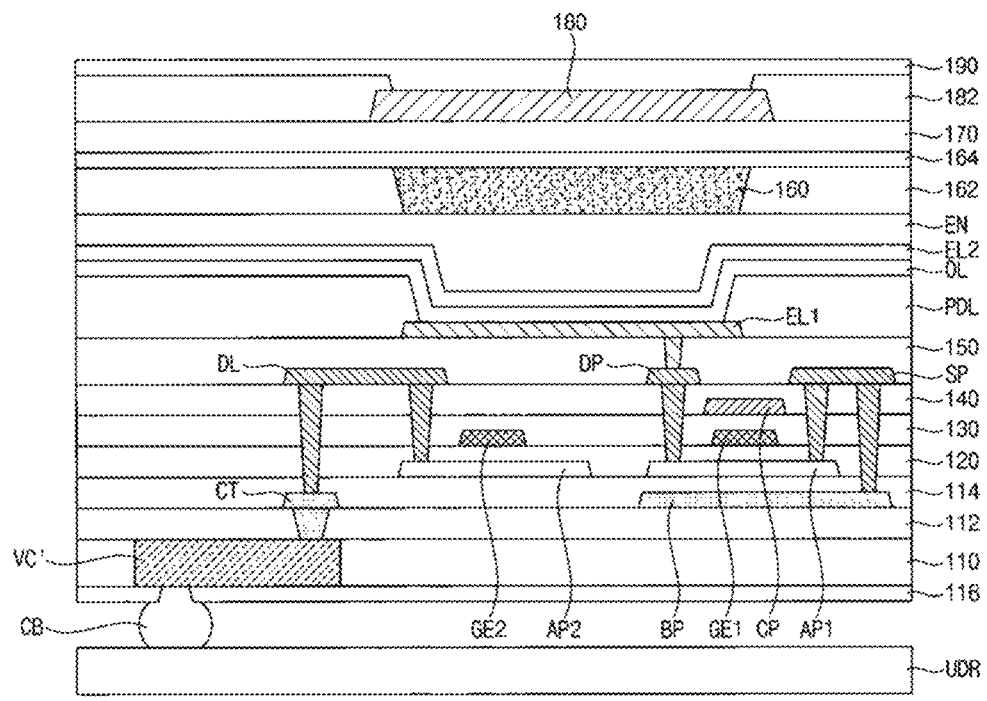

FIGS. 11 and 12 are cross-sectional views illustrating a display device according to alternative embodiments.

Referring to FIG. 11, an alternative embodiment of a display device includes a display panel and an under-panel driver disposed under the display panel. The under-panel driver may electrically contact the display panel in an area overlapping a display area.

The display panel includes a base substrate 110 and a vertical conductive member VC disposed through the base substrate 110. The display panel includes a signal wiring for receiving a signal or a power voltage through the vertical conductive member VC. In one embodiment, for example, the display panel may include a data line DL for receiving a data signal through the vertical conductive member VC. A connection pattern CT may be disposed on the vertical conductive member VC. The connection pattern CT may electrically contact the data line DL. The connection pattern CT may be disposed in a same layer as a lower shielding pattern BP disposed under an active pattern.

However, embodiments are not limited thereto. In one alternative embodiment, for example, the data line DL may directly contact the vertical conductive member VC.

In an embodiment, a first transfer wiring TL1' may be disposed on a lower surface of the base substrate 110. The first transfer wiring TL1' may electrically contact the vertical conductive member VC, and may extend in a horizontal direction. In an embodiment, the first transfer wiring TL1' may include a plurality of first transfer lines. Ends of the first transfer lines may be arranged in a bonding area and may define or form connection pads.

In an embodiment, as shown in FIG. 11, a lower capping layer 116 may be further disposed or formed on the lower surface of the base substrate 110. In such an embodiment, an opening is defined through the lower capping layer 116 to overlap an end of the first transfer wiring TL1'. The end of the first transfer wiring TL1' may be exposed through the opening, and may be electrically connected to an under-panel driver UDR through a conductive bonding member CB.

The lower capping layer 116 may include an organic material, an inorganic material or a combination thereof, and may have a single-layered structure or a multi-layered structure.

In an embodiment, a wiring may be disposed or formed on the lower surface of the base substrate 110, the wiring may have a fan-out shape similar to the first transfer wiring TL1 illustrated in FIG. 3.

Referring to FIG. 12, another alternative embodiment of a display device includes a display panel and an under-panel driver disposed under the display panel. The under-panel driver may electrically contact the display panel in an area overlapping a display area.

The display panel includes a base substrate 110 and a vertical conductive member VC' disposed through the base substrate 110. The display panel includes a signal wiring for receiving a signal or a power voltage through the vertical conductive member VC'. In one embodiment, for example, the display panel may include a data line DL for receiving a data signal through the vertical conductive member VC'. A connection pattern CT may be disposed on the vertical conductive member VC'. The connection pattern CT may electrically contact the data line DL. The connection pattern CT may be disposed in a same layer as a lower shielding pattern BP disposed under an active pattern.

In an embodiment, as shown in FIG. 12, the vertical conductive member VC' may extend in a horizontal direction. In one embodiment, for example, the vertical conductive member VC' may include a plurality of transfer lines extending to have a planar shape similar to the first transfer wiring TL1 illustrated in FIG. 3.

In an embodiment, ends of the transfer lines may be arranged in a bonding area and may define or form connection pads.

In such an embodiment, a lower capping layer 116 may be disposed on the lower surface of the base substrate 110. In such an embodiment, an opening is defined through the capping layer 116 to overlap an end of the vertical conductive member VC'. The end of the vertical conductive member VC' may be exposed through the opening, and may be electrically connected to an under-panel driver UDR through a conductive bonding member CB.

In an embodiment, the vertical conductive member VC' may have a fan-out shape to function as a transfer wiring.

In one embodiment, for example, embodiments may include a tiled display device, which has an expanded display area by combination of a plurality of sub display panels. However, embodiments are not limited thereto. In one embodiment, for example, embodiments may include a display device with a single display panel.

Embodiments of the display device described herein may be an organic-light emitting display device. However, embodiments are not limited thereto. Alternatively, embodiments may include various display devices such as a electroluminescent display device, a micro light emitting diode ("LED") display device or the like, for example.

Embodiments may be applied to various display devices, e.g., vehicle-display device, a ship-display device, an aircraft-display device, portable communication devices, display devices for display or for information transfer, a medical-display device, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a base substrate including a rigid material;
a plurality of pixels disposed on a display area of the base substrate;
a vertical conductive member disposed through the display area of the base substrate;
a first transfer wiring electrically contacting the vertical conductive member and extending in a horizontal direction; and
an under-panel driver disposed under the base substrate and electrically connected to the vertical conductive member,
wherein the base substrate is combined with the under-panel driver through a conductive bonding member, and the conductive bonding member electrically contacts the vertical conductive member.

2. The display device of claim 1, wherein the base substrate includes glass.

3. The display device of claim 1,
wherein each of the pixels includes an active pattern, a gate electrode overlapping the active pattern and a signal wiring electrically connected to the active pattern, and
wherein the vertical conductive member is electrically connected to the signal wiring.

4. The display device of claim 3, wherein the first transfer wiring is disposed on an upper surface of the base substrate, and electrically contacts the signal wiring.

5. The display device of claim 4, further comprising:
a first insulation layer covering the first transfer wiring,
wherein the active pattern is disposed on the first insulation layer.

6. The display device of claim 3, wherein the first transfer wiring is disposed on a lower surface of the base substrate, and is partially covered by a lower capping layer disposed on the lower surface of the base substrate.

7. The display device of claim 3, wherein the signal wiring includes a data line.

8. The display device of claim 3, wherein the signal wiring includes a power line.

* * * * *